(12) United States Patent
Pal et al.

(10) Patent No.: US 8,735,200 B2
(45) Date of Patent: May 27, 2014

(54) FABRICATION OF ROBUST ELECTROTHERMAL MEMS WITH FAST THERMAL RESPONSE

(76) Inventors: Sagnik Pal, Gainesville, FL (US); Huikai Xie, Gainesville, FL (US)

( * ) Notice: Subject to any disclaimer, the term of this patent is extended or adjusted under 35 U.S.C. 154(b) by 53 days.

(21) Appl. No.: 13/311,693

(22) Filed: Dec. 6, 2011

(65) Prior Publication Data
US 2012/0319226 A1 Dec. 20, 2012

Related U.S. Application Data

(60) Provisional application No. 61/422,320, filed on Dec. 13, 2010.

(51) Int. Cl.
*H01L 21/00* (2006.01)

(52) U.S. Cl.
USPC .............................................. 438/54; 310/307

(58) Field of Classification Search
USPC ............................................ 438/54; 310/307
See application file for complete search history.

(56) References Cited

U.S. PATENT DOCUMENTS

| 7,545,251 | B2 | 6/2009 | McAvoy et al. | |
|---|---|---|---|---|
| 8,018,316 | B2 * | 9/2011 | Pardo et al. | 337/123 |
| 8,027,077 | B2 * | 9/2011 | Border | 359/224.1 |
| 2003/0132823 | A1 * | 7/2003 | Hyman et al. | 335/78 |
| 2004/0012298 | A1 * | 1/2004 | Cunningham et al. | 310/306 |
| 2006/0038643 | A1 * | 2/2006 | Xu et al. | 335/78 |
| 2006/0285189 | A1 * | 12/2006 | Mills et al. | 359/224 |
| 2008/0129792 | A1 * | 6/2008 | McAvoy et al. | 347/61 |
| 2008/0191303 | A1 * | 8/2008 | Carlson et al. | 257/467 |
| 2009/0206702 | A1 * | 8/2009 | Kawakubo et al. | 310/330 |
| 2010/0033788 | A1 * | 2/2010 | Xie et al. | 359/198.1 |
| 2010/0245966 | A1 * | 9/2010 | Yasuda | 359/224.1 |
| 2012/0119619 | A1 * | 5/2012 | Smits | 310/323.01 |

FOREIGN PATENT DOCUMENTS

WO WO 2009079460 A1 * 6/2009

OTHER PUBLICATIONS

Srinivasan, P. et al., "Effect of Heat Transfer on Materials Selection for Bimaterial Electrothermal Actuators," J. Microelectomechanical Sys., 2008, vol. 17, No. 3, pp. 653-667.*
Luo, J. et al., "Diamond and Diamond-like Carbon MEMS," J. Micromech. Microeng., 2007, vol. 17, pp. S147-S163.*
Pal, S. et al., "A Curved Multimorph Based Electrothermal Micromirro with Large scan Range and Low Drive Voltage," Sensors and Actuators A: Physical, 2011, vol. 170, pp. 156-163.*
Wu, L. et al., "A Large Vertical Displacement Electrothermal Bimorph Microactuator with Very Small Lateral Shift," Sensors and Actuators A: Physical, 2007, vol. 145-146, pp. 371-379.*
Luo, J. et al., "Fabrication and characterization of diamond-like carbon/Ni bimorph normally closed microcages," J. Micromech. Microeng., 2005, vol. 15, pp. 1406-1413.*

(Continued)

*Primary Examiner* — Steven J Fulk
(74) *Attorney, Agent, or Firm* — Saliwanchik, Lloyd & Eisenschenk, P.A.

(57) ABSTRACT

Embodiments of the invention provide robust electrothermal MEMS with fast thermal response. In one embodiment, an electrothermal bimorph actuator is fabricated using aluminum as one bimorph layer and tungsten as the second bimorph layer. The heating element can be the aluminum or the tungsten, or a combination of aluminum and tungsten, thereby providing a resistive heater and reducing deposition steps. Polyimide can be used for thermal isolation of the bimorph actuator and the substrate. For MEMS micromirror designs, the polyimide can also be used for thermal isolation between the bimorph actuator and the micromirror.

18 Claims, 10 Drawing Sheets

(56) References Cited

OTHER PUBLICATIONS

Pal, S., et al., "Distribute and lumped element models for bimorph-actuated micromirror," Journal of Micromechanics and Microengineering, 2010, vol. 20, No. 4, 045020, pp. 1-12.

Jia, K., et al., "An Electrothermal Tip-Tilt-Piston Micromirror Based on Folded Dual S-Shaped Bimorphs," Journal of Microelectromechanical Systems, 2009, vol. 18, No. 5, pp. 1004-1015.

Wu, L., et al., "A large vertical displacement electrothermal bimorph microactuator with very small lateral shift," Sensors and Actuators A, 2008, vol. 145-146, pp. 371-379.

Moulton, T., et al., "Micromechanical devices with embedded electro-thermal-compliant actuation," Sensors and Acuators A, 2001, vol. 90, pp. 38-48.

Srinivasan, P., et al., "Effect of Heat Transfer on Materials Selection for Bimaterial Electrothermal Actuators," Journal of Microelectromechanical Systems, 2008, vol. 17, No. 3, pp. 653-667.

* cited by examiner

FIG. 10B

FABRICATION OF ROBUST ELECTROTHERMAL MEMS WITH FAST THERMAL RESPONSE

CROSS-REFERENCE TO RELATED APPLICATION

The present application claims the benefit of U.S. Provisional Application Ser. No. 61/422,320, filed Dec. 13, 2010, which is hereby incorporated by reference herein in its entirety, including any figures, tables, or drawings.

This invention was made with government support under Contract No. 0725598 awarded by the National Science Foundation. The U.S. Government has rights in this invention.

BACKGROUND OF THE INVENTION

Electrothermal bimorph microactuators provide large displacement at low voltages. Several electrothermal bimorph MEMS (microelectromechanical system) designs utilize a $SiO_2$ thin film as an active bimorph layer and for thermal isolation. However, the brittle nature of $SiO_2$ makes the micromirrors susceptible to impact failure. Additionally the low diffusivity of $SiO_2$ makes the thermal response slow.

Several metal-polymer based thermal bimorph actuators have been explored. For these devices, the polymer layer is much thicker than the metal layer because polymers have the lowest Young's modulus among MEMS materials. Since metals have a much higher thermal diffusivity than polymers, the thermal response of bimorph actuators is mainly determined by thermal diffusivity of the polymer. Typically, MEMS polymers have very low thermal diffusivity ($\sim 10^{-7}$ $m^2/s$), which makes the thermal response slow.

Accordingly, there continues to be a need in the art for improved MEMS devices that are less susceptible to impact failure and that show fast thermal response.

BRIEF SUMMARY

The present invention provides electrothermal structures and systems for MEMS applications and methods of fabricating such structures and systems. Embodiments of the invention utilize material pairs with high thermal diffusivity to fabricate robust electrothermal MEMS. In certain embodiments, material pairs of aluminum with one of tungsten (Al—W pair), a nickel steel alloy (Al-nickel steel alloy pair), and a diamond-like carbon (Al-diamond-like carbon pair) can be used to fabricate bimorph electrothermal actuators. In a further embodiment, polyimide or the nickel steel alloy is used for thermal isolation of the bimorph electrothermal actuators.

The subject material pairs can be used to produce robust MEMS with fast thermal response.

According to one aspect of the invention, thermal bimorph MEMS are provided that are less susceptible to impact failure and have high thermal speed as compared to bimorphs using $SiO_2$ as an active bimorph layer.

Embodiments of the invention provide methods of fabricating robust electrothermal MEMS. Such robust electrothermal MEMS can be applied to mirrors for biomedical imaging, displays, and other products.

BRIEF DESCRIPTION OF THE DRAWINGS

FIGS. 4A and 4B show images of scanning micromirrors fabricated in accordance with an embodiment of the invention.

FIGS. 9A and 9B show plots of optical scan angle versus input power, indicating power consumption for devices fabricated in accordance with embodiments of the invention.

DETAILED DISCLOSURE

Embodiments of the present invention provide electrothermal structures and systems for MEMS applications and methods of fabricating such structures and systems. Fast thermal response for electro-thermally actuated MEMS devices are provided by utilizing structures and fabrication processes of embodiments of the invention.

In MEMS devices, electrothermal actuation can be accomplished through bi-layer (bimorph) or multi-layer structures with materials having different coefficients of thermal expansion (CTEs), which generate motion with a change in temperature. The temperature-induced motion is caused by the CTE difference of the materials forming the bimorphs. The bimorph actuators can have a layer of a first material on top of a layer of a second material. Because the CTEs of the first material and the second material are different, when heat is applied, one of the two materials tends to expand or shrink more than the other of the two materials, resulting in a bending of the bimorph beam expanding in a motion similar to muscles expanding and contracting. The temperature change for the actuator can be provided by an integrated heater formed of a same material as one or both of the first and second materials, or a third material that is different than one or both of the first and second materials.

Electrothermal actuators can be used in various applications, such as biomedical imaging, optical displays, laser beam steering, communications, space exploration, and surveillance. Electrothermal actuators can be used to move an object such as an antenna, lens, platform, and mirror. A micromirror is an optical device that has a mirror plate moved by one or more microactuators. A micromirror can be used for steering a radiation beam and/or laser beam.

Table I provides property values of materials that can be used for fabricating fast, robust electro-thermally actuated micromirrors (or other objects). It should be noted that certain values listed in Table I are obtained from the reported literature.

TABLE I

| Material | Young's Modulus (GPa) | CTE (microns per m/K) | Thermal Conductivity (W/m/K) | Thermal diffusivity ($m^2$/s) | Electrical conductivity (S/m) | Comments |
| --- | --- | --- | --- | --- | --- | --- |
| Aluminum (Al) | 70 | 23.1 | 237 | $9.7 \times 10^{-5}$ | $35.5 \times 10^6$ | High CTE, Fast thermal response |
| Tungsten (W) | 411 | 4.5 | 174 | $6.8 \times 10^{-5}$ | $20 \times 10^6$ | Can be used as heater and active bimorph layer |
| Invar | 145 | 0.36 | 13 | $3.1 \times 10^{-6}$ | | One of the least conductive metals |
| DLC | 700 | 1.18 | 1100 | $6.06 \times 10^{-4}$ | Doping dependent | High thermal speed |
| Polyimide | 2.3 | 20 | 0.15 | $1.04 \times 10^{-7}$ | Insulator | Good isolation |

Invar is the nickel steel alloy 64FeNi (or FeNi36) manufactured by ArcelorMittal. While Invar is referred to herein as a material for fabricating electrothermal MEMS devices, other 64FeNi manufacturers may be used.

As shown in Table I, Al, W, Invar, and DLC (a hard carbon film referred to as "diamond-like carbon") have reasonably high thermal diffusivity and can be used as one of the bimorph layers. Invar and polyimide have low thermal conductivity and may be used for thermal isolation at one or both ends of the bimorph actuators. Thermal isolation confines the heat energy to the actuators and thereby reduces power consumption.

According to one embodiment, a bimorph actuator for a MEMS device can be fabricated from Al and DLC. Both Al and DLC have high thermal diffusivity. Additionally, DLC has very high fracture strength. The Al can serve as a resistive heating element for Al-DLC bimorphs. In an embodiment, one or more other metals such as platinum (Pt) can be used for the resistive heating element of the actuator.

According to another embodiment, a bimorph actuator for a MEMS device can be fabricated from Al and Invar. Both Al and Invar have a higher thermal diffusivity than $SiO_2$ and polymers. Therefore, Al-Invar bimorphs of certain embodiments of the invention have a reasonably fast thermal response as compared to bimorph actuators formed with $SiO_2$ or polymer as one of the material layers. According to an embodiment, Al or Invar or the combination of the two may act as a resistive heating element for the actuator.

According to yet another embodiment, a bimorph actuator for a MEMS device can be fabricated from Al and W. Both Al and W have higher thermal diffusivity than $SiO_2$ and polymers. Therefore, Al—W bimorphs of certain embodiments of the invention have a reasonably fast thermal response as compared to bimorph actuators formed with $SiO_2$ or polymer as one of the material layers. According to an embodiment, Al or W or the combination of the two may act as a resistive heating element for the actuator.

According to certain embodiments, a fabrication process flow is provided for robust electrothermal bimorph MEMS with fast thermal response.

In one embodiment described herein, the active layers of the bimorph are Al (aluminum) and W (tungsten). In such an embodiment, W can also be used to form a resistive heater. However, embodiments are not limited to using W as the resistive heating element. High temperature polyimide can be used for thermal isolation at one or both ends of the bimorphs (see e.g., FIGS. 3A and 3B described in more detail later).

Figure 1:
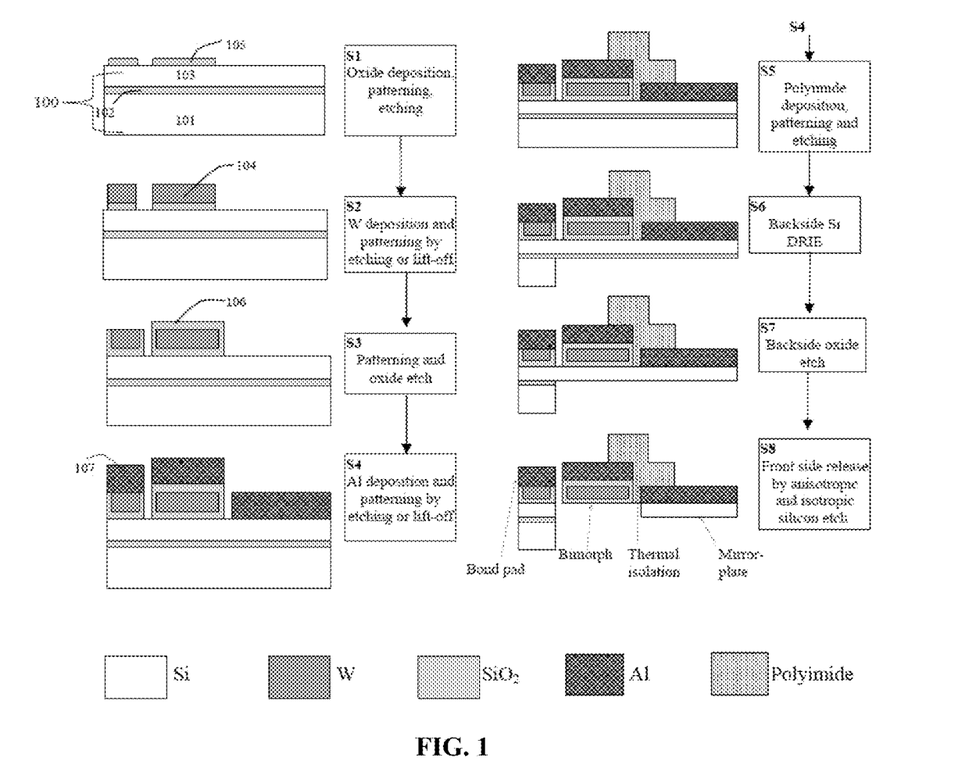
FIG. 1 illustrates a process flow of a MEMS device according to one embodiment of the invention.

FIG. 1 shows a process flow diagram with corresponding cross-sectional images of a portion of a wafer for illustrating a fabrication process according to an embodiment of the invention. The fabrication of electrothermal micromirrors has been illustrated. However, the process may be adapted for a wide range of thermal bimorph actuated MEMS devices.

Referring to FIG. 1, a silicon-on-insulator (SOI) wafer 100 can be prepared having a silicon substrate 101, silicon device layer 103, and buried oxide layer 102. Referring to step S1, oxide is deposited on the SOI wafer 100, a patterning process is performed to form a pattern etch mask on the oxide, and the oxide is etched using the pattern etch mask. Referring to step S2, Tungsten (W) 104 is then deposited on the etched oxide 105 and patterned by etching or lift-off process. Then, in step S3, a second oxide 106 is deposited on the tungsten. A second patterning process is performed to form a second pattern etch mask on the second oxide, and the second oxide is etched using the second pattern etch mask, which defines contact pads and the bimorph actuators. As shown in the cross-sectional image corresponding to step S3, the second oxide 106 can be used to encapsulate the W that forms part of the actuator beam. In certain embodiments, the second oxide 106 can be removed from the top surface of the first bimorph material (in this case the W), such as with the bond pad region.

Next, referring to step S4, Aluminum (Al) is deposited and patterned by etching or lift-off. The Al deposited in S4 defines the contact pads and bimorphs. For embodiments fabricating a micromirror, the Al deposition and patterning also defines the mirror plate of the micromirror. Next, in step S5, polyimide for thermal isolation of the bimorph actuator is deposited (which can also be referred to as beam-type isolation), followed by a patterning process and etching of the polyimide. Then, referring to steps S6 and S7, a backside Si DRIE (Deep Reactive Ion Etching) is performed to expose the buried oxide layer though the silicon substrate of the SOI wafer and a backside oxide etch is performed to expose the silicon device layer through the buried oxide layer. The bimorph actuators can be released, as shown in step S8, by performing a front side release by anisotropic and isotropic silicon etching.

In the drawings, polyimide thermal isolation is shown on one end of the bimorph only. However, depending on the design, thermal isolation can be provided at both ends of the bimorph.

The SiO$_2$ deposited in step S3 of FIG. 1 electrically isolates the Al and W layers in the bimorph region. Additionally, the oxides deposited in steps S1 and S3 encapsulate the Tungsten layer in the bimorphs and this encapsulation can protect the Tungsten from etchant species in subsequent fabrication steps. Other electrical insulators such as titanium oxide may also be used for this purpose in place of the SiO$_2$. Additionally, some MEMS devices may not have any electrical isolation between the Al and W layers. In such devices, the Al—W bilayer will act as the resistive heater.

Figure 2:
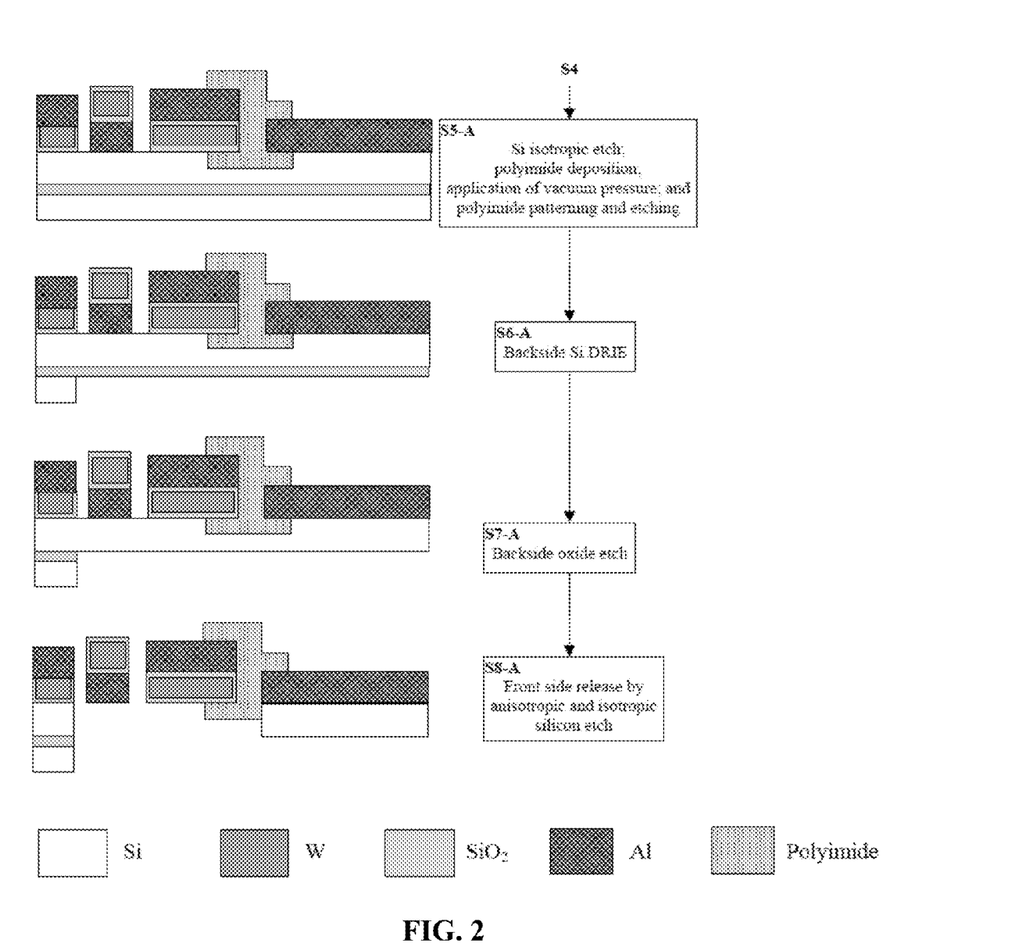
FIG. 2 illustrates a process flow of a MEMS device according to another embodiment of the invention.

FIG. 2 shows another embodiment of the fabrication process. For the process shown in FIG. 2, steps S1-S4 can be the same as shown in FIG. 1 and are therefore omitted. However, for the embodiment shown in FIG. 2, prior to polyimide deposition, Si isotropic etching can be performed in order to create a cavity. In particular, as shown for step S5-A, after polyimide deposition, the wafer can be placed in vacuum to force the polyimide into the cavity. The vacuum is provided at pressures capable of forcing the polyimide into the cavity. By subjecting the wafer to a vacuum, better mechanical connection at the polyimide junction can be accomplished. The polyimide is then patterned and etched. Next, analogous to steps S6-S8 of FIG. 1, in step S6-A, backside Si DRIE is performed, followed by the backside oxide etch of step S7-A. Finally, front side release by anisotropic and isotropic silicon etch is performed to release the bimorph actuators in step S8-A.

The inclusion of a trench filled with material for thermal isolation can also be referred to as trench-filled isolation.

According to another embodiment, Si isotropic etching to form an isolating cavity for polyimide can be performed before, during, or immediately following step S1. In certain embodiments, the trench can be filled with polyimide before depositing the oxide in step S1. In one embodiment, the polyimide is patterned and etched before depositing the oxide in step S1. In another embodiment, the oxide deposited in step S1 can also be deposited on the polyimide and both the oxide layer and polyimide layer can be patterned and etched during step S1.

Although these method steps specify Al and W for the actuators, embodiments are not limited thereto. For example, other bimorph combinations such as Al-DLC and Al-Invar can be used. When DLC is used in place of the W, the Al can be used for the resistive heating element. When Invar is used in place of the W, Al or Invar, or a combination of Al and Invar can be used as the resistive heating element.

Figure 3:
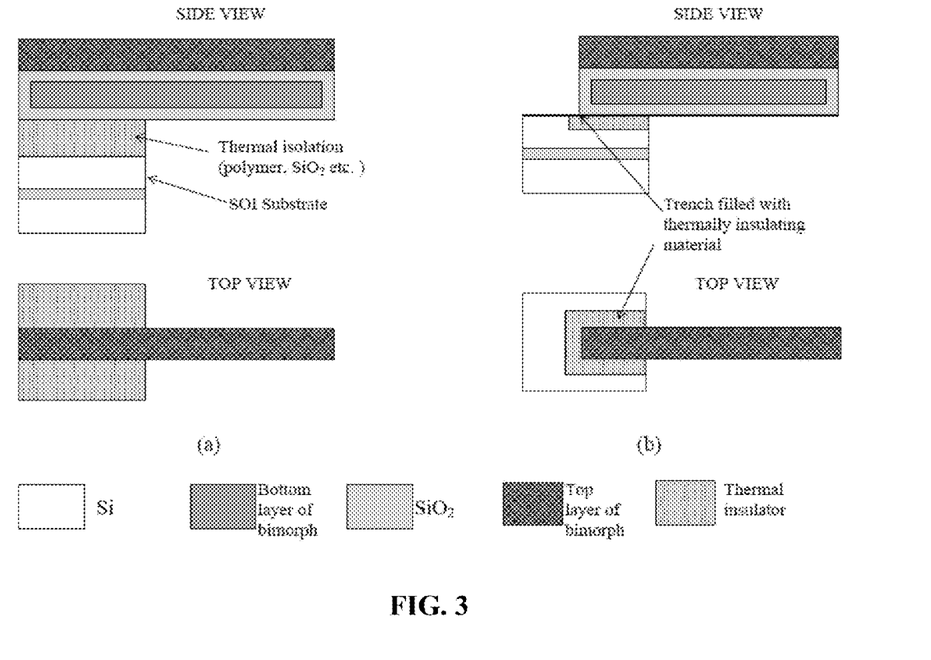
FIG. 3A shows a side view and a top view of a robust bimorph-substrate junction with thermal insulator sandwiched between bimorph and substrate according to one embodiment of the invention.
FIG. 3B shows a side view and a top view of a robust bimorph-substrate junction with trench filled with thermally insulating material according to another embodiment of the invention.

FIGS. 3A and 3B show two examples of robust designs for the bimorph-substrate junctions with large thermal isolation that may be fabricated using a process similar to that described with respect to FIGS. 1 and 2. It should be noted that the cross-section shown in FIGS. 1 and 2 does not illustrate the beam extending to a location where the bimorph actuator contacts the substrate other than illustrating the bonding pad region.

FIG. 3A shows a cross-sectional side view and a top view showing thermal isolation between a bimorph beam and the substrate where the thermal isolation is provided by an isolating layer formed on the substrate. This layer can be a polymer, an oxide, or other insulating material. In an embodiment, the isolating layer can be formed during the step described with respect to S1 of FIG. 1. In one embodiment, the isolating layer can be formed of the oxide layer deposited, patterned and etched during S1. In another embodiment, a layer of polyimide or other polymer can be deposited on the SOI wafer in place of, or in addition to, the patterned oxide 105.

FIG. 3B shows a cross-sectional side view and a top view showing thermal isolation between a bimorph beam and the substrate where the thermal isolating is provided by an isolating layer formed in a trench in the substrate. This isolating layer can be a polymer, an oxide, or other insulating material. In one embodiment, the trench and isolating layer can be formed before forming the first material of the bimorph actuator. In another embodiment, a Si isotropic etch can be performed to remove the silicon around and below the bimorph beam. Then, a thermally insulating material can be deposited in the trench. A vacuum pressure can be applied to help force the insulating material into the trench below the bimorph beam. In one embodiment, this can be performed during the step described with respect to S5-A of FIG. 2.

For electrothermal micromirror fabrication, such thermal insulating junctions may be fabricated between the bimorph and the mirror-plate as well.

Embodiments of the invention can be used for fabricating robust electrothermal MEMS with fast thermal response. The subject methods and structures can be adopted for a wide range of applications including but not limited to micromirrors for biomedical imaging, optical displays, and microscanners.

EXAMPLES

Micromirrors actuated by Al—W bimorphs with W acting as a resistive heater in accordance with one embodiment of the invention were fabricated. A 5 µm-thick polyimide (PI-2574, HD MicroSystems) layer was used for thermal isolation.

Figure 4A:
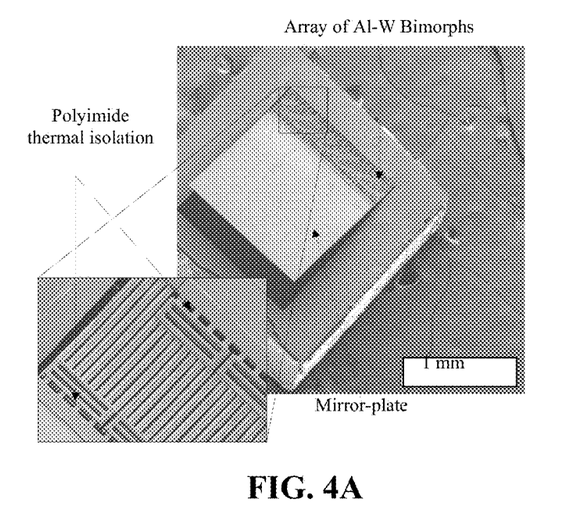
FIG. 4A shows a one-dimensional scanning micromirror and FIG. 4B shows a two-dimensional scanning micromirror.
Figure 4B:
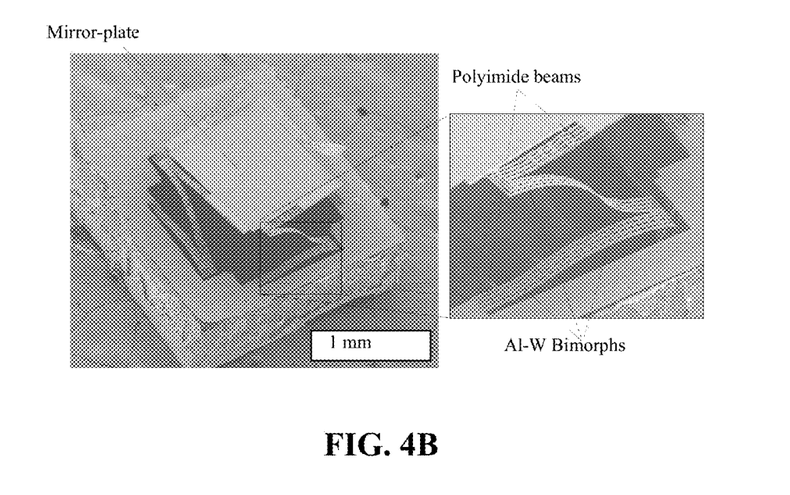

FIGS. 4A and 4B respectively show images of a 1D micromirror and a 2D micromirror that were fabricated. The 1D mirror device has a bimorph array with a mirror-plate of 1.2 mm×1.1 mm. The 2D mirror device has four folded, multi-segment bimorph actuators symmetrically placed on four sides of a 0.98 mm×0.98 mm mirror-plate.

Figure 5:
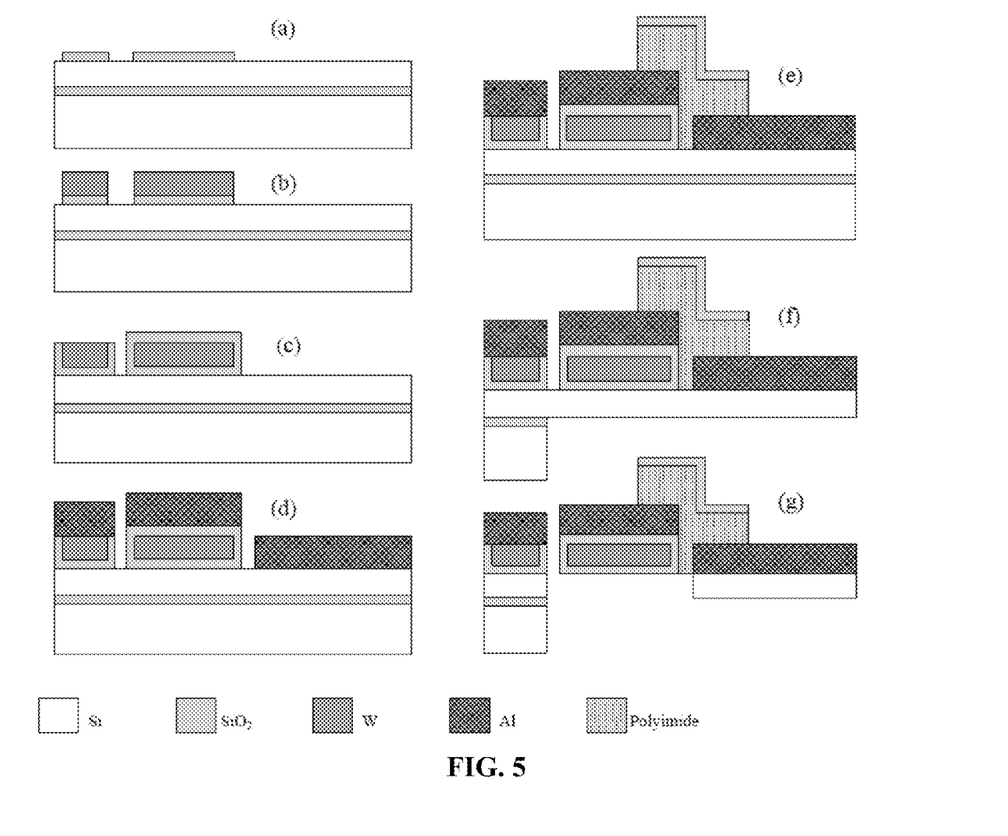
FIG. 5 illustrates a fabrication process used for fabricating the one-dimensional scanning micromirror of FIG. 4A according to an embodiment of the invention.

The fabrication process for the mirror shown in FIG. 4A is illustrated in FIG. 5. As can be seen from the process steps (a)-(g) of FIG. 5, the fabrication process for the specific example follows the method described with respect to FIG. 1. In particular, in FIG. 5, step (a) illustrates oxide deposition, patterning, and etching on SOI wafer; step (b) illustrates W sputtering and lift-off; step (c) illustrates oxide deposition, patterning, and etching; step (d) illustrates Al sputtering and lift-off; step (e) illustrates polyimide and protective oxide deposition, patterning, and etching; step (f) illustrates backside lithography and DRIE Si etch; and step (g) illustrates front-side isotropic Si etch for device release. The protective oxide in step (e) can act as a mask for polyimide etching and provide protection to the polyimide from oxygen plasma that may be used in subsequent processing steps.

For the example embodiment, SOI wafers are used to ensure the flatness of mirror plates with single-crystal-silicon microstructures. The Al and W layers formed during W and Al deposition (via sputtering) are 0.58 µm and 0.6 µm thick, respectively. Thermal isolation via the polyimide is shown at only one end of the bimorph. However, in certain embodiments, isolation can be at both ends.

The SiO$_2$ deposited in the step (c) of FIG. 5 electrically isolates the Al and W layers. Both Al and W are fabricated by sputtering and lift-off (as shown in step (b) for tungsten patterning and step (d) for aluminum patterning). In addition, according to this embodiment, polyimide is spin coated, baked and then covered with PECVD SiO$_2$ (step (e)). Here, the PECVD oxide is used as a mask to etch the polyimide. However, in certain embodiments, the polyimide is directly etched without using any oxide. A similar variation using the PECVD SiO$_2$ can be applied to the embodiment illustrated in step S5-A of FIG. 2.

Oxygen plasma may be used to clean photoresist residue on the wafer or individual devices after using a patterned photoresist as an etch mask. This oxygen plasma, when used in steps subsequent to the polyimide deposition, may also attack the polyimide layer. Accordingly, the PECVD oxide can also be used to protect the polyimide from oxygen plasma during subsequent processing.

Referring again to FIG. 5, the device is released by backside DRIE silicon etching shown in step (f) and frontside isotropic silicon etching shown in step (g).

Figure 6A:
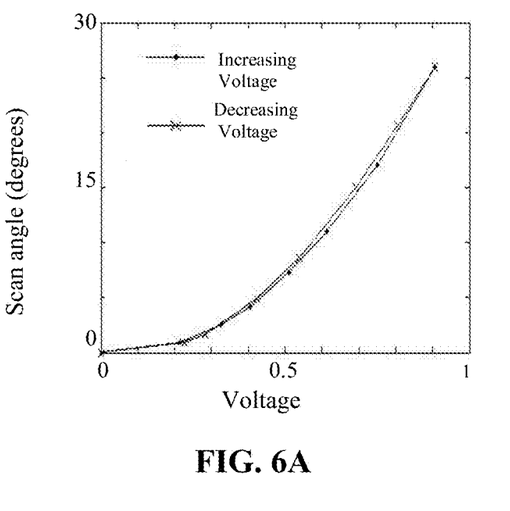
FIGS. 6A and 6B show plots of dc characteristics (FIG. 6A) and frequency response (FIG. 6B) obtained using a sine wave input with 25 mV amplitude at 870 mV offset for device shown in FIG. 4A.
Figure 6B:
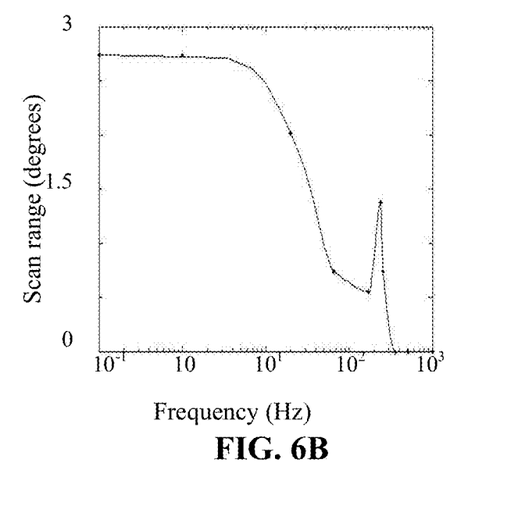

The static characteristics and frequency response of the 1D micromirror depicted in FIG. 4A are respectively shown in FIGS. 6A and 6B. A 25° scan angle is obtained at 0.9V, or 35 mW, which is comparable to mirrors actuated by Al—SiO$_2$ bimorphs. As shown in FIG. 6B, the polyimide thermal isolation results in a large thermal time constant.

Figure 7:
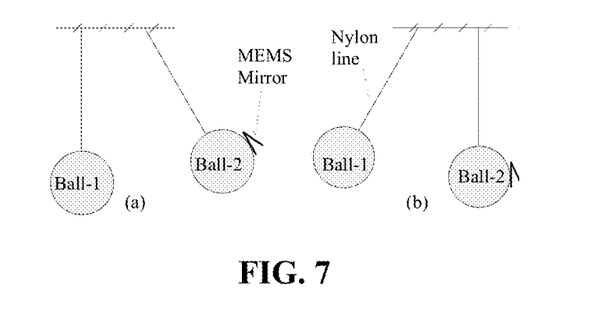
FIG. 7 shows a representation of the impact test for the device shown in FIG. 4A.

FIG. 7 illustrates the schematic for the mirror robustness test, which was implemented using a commercially available Newton's cradle in accordance with D. R. Lovett, et al., "Collisions between elastic bodies: Newton's cradle," *European Journal of Physics*, vol. 9, pp. 323-328, 1988, which is hereby incorporated by reference. As shown in FIG. 7, two steel balls of diameter 22 mm are suspended from a height of 130 mm. Impact is tested by attaching the test mirror to one of the two steel balls. Representation (a) illustrates the system before impact and representation (b) illustrates the system after impact.

Referring to FIG. 7, for the mirror robustness test, the mirror is attached to Ball-2 which suffers an impact with Ball-1. The maximum acceleration in m/s$^2$ experienced by the mirror is given by $a_{max}=(14352.9\ g)\times h^{3/5}$, where g is the acceleration due to gravity (m/s$^2$) and h is the drop height (m).

It was found that mirrors with SiO$_2$ thermal isolation fail in the 800 g-1000 g range. In contrast, the device fabricated in accordance with an embodiment of the invention can withstand accelerations greater than 4000 g which is the maximum that can be generated by the setup in FIG. 7.

Accordingly, electrothermal micromirrors actuated by Al—W bimorphs demonstrate much better robustness as compared with micromirrors actuated by Al—SiO$_2$ bimorphs. The process can be adapted to a wide range of electrothermal MEMS. High thermal diffusivities of Al and W and low thermal conductivity of polyimide allow the optimization of device speed and power consumption.

Figure 8:
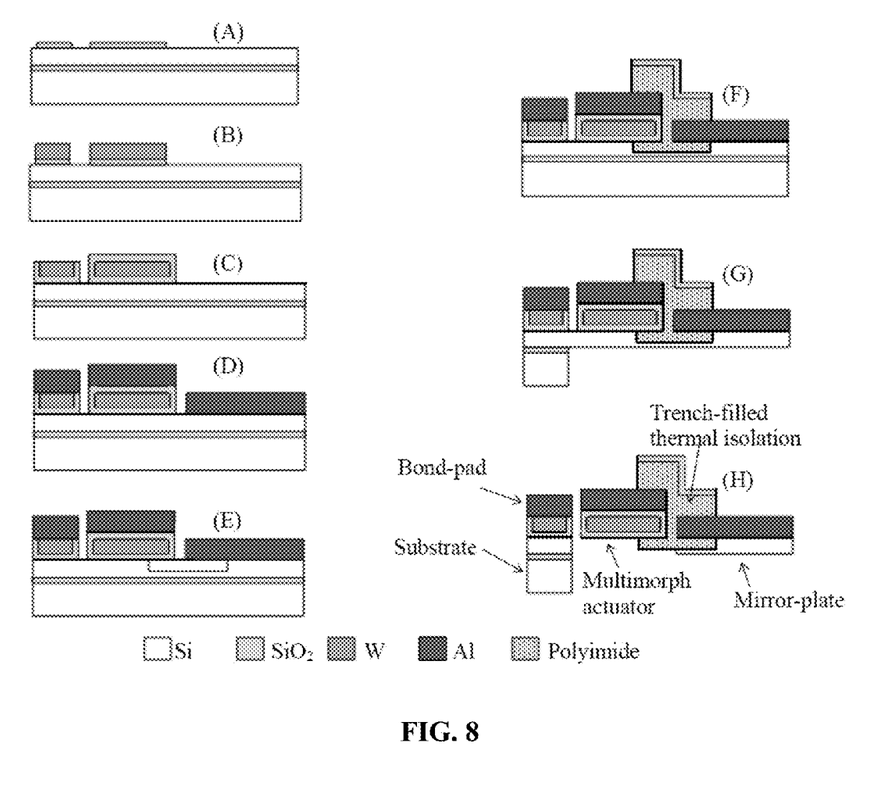
FIG. 8 illustrates a fabrication process used for fabricating a scanning micromirror according to another embodiment of the invention.

Additional samples were fabricated using the fabrication process illustrated in FIG. 8, which incorporates the fabrication steps shown in FIG. 2 for forming mirrors with trench isolation.

As can be seen from the process steps (a)-(h) of FIG. 8, the fabrication process for the additional samples follow the method described with respect to FIG. 2. In particular, in FIG. 8, step (a) illustrates oxide deposition, patterning, and etching on SOI wafer; step (b) illustrates W sputtering and lift-off; step (c) illustrates oxide deposition, patterning, and etching; step (d) illustrates Al sputtering and lift-off; step (e) illustrates trench formation by Si isotropic etching using RIE; step (f) represents polyimide dispensation with an applied vacuum pressure for trench filling, spin coating the polyimide, baking of the polyimide, oxide deposition, patterning, oxide etching, and polyimide etching; step (g) illustrates backside lithography, DRIE Si etch, and buried oxide etch; and step (h) illustrates front-side isotropic Si etch for device release. The oxide in step (f) can act as a mask for polyimide etching and provide protection to the polyimide from oxygen plasma that may be used in subsequent processing steps.

In the above described example sample fabrication, trenches were etched in silicon after forming the actuators, mirror-plate, and other elements (see e.g. step (e)). Then, as mentioned with respect to step (f), polyimide solution was dispensed on the wafer and the wafer was put in a vacuum. As a result, the polyimide solution filled up the trenches. Thereafter, the dispensed polyimide solution was spin-coated and baked.

During analysis of the samples fabricated as described with respect to FIG. 8, it was found that the trenches were not completely filled with polyimide. In accordance with certain embodiments of the invention utilizing trench isolation, improved trench filling may be accomplished by utilizing silicon trenches with negative sidewalls (etched in a manner that the bottom of the trench is wider than the top of the trench), which may minimize the outflow of polyimide solution from the trench during wafer spinning. Of course, in certain embodiments of the invention, the polyimide-filled trenches can be formed during an earlier step of the process flow. For example, before performing step (a), trenches may be etched in the device layer of the SOI wafer. The polyimide solution can be dispensed onto the wafer followed by subjecting the wafer to vacuum pressure, spin coating and baking to form a single layer of polyimide in the trench. Several layers of polyimide may be successively deposited until the trenches are completely filled. Once the trenches are completely filled with polyimide, chemical mechanical polishing (CMP) may be used to remove any excess polyimide from the wafer and planarize the surface. Thin-film processing may then be performed to form the actuators, mirror-plate, and other elements as described with respect to FIG. 1.

In the trench-filled designs of certain embodiments of the invention, a thick layer of polyimide (a few microns ~tens of microns) between the actuators and the substrate/mirror-plate can provide thermal isolation. Although SiO$_2$ may be used in certain cases for thermal isolation, thick SiO$_2$ layers tend to crack due to internal stresses.

In accordance with certain embodiments of the invention, device speed and power consumption can be customized during the design layout. There is a trade-off between device speed and power consumption according to thermal isolation design. For example, a same fabrication process can be carried out regardless of whether a device is designed with thermal isolation on both ends of the actuators or with thermal isolation between the actuators and the mirror plate only. To illustrate this point, sample devices were fabricated using the method described with respect to FIG. 5.

Figure 9A:
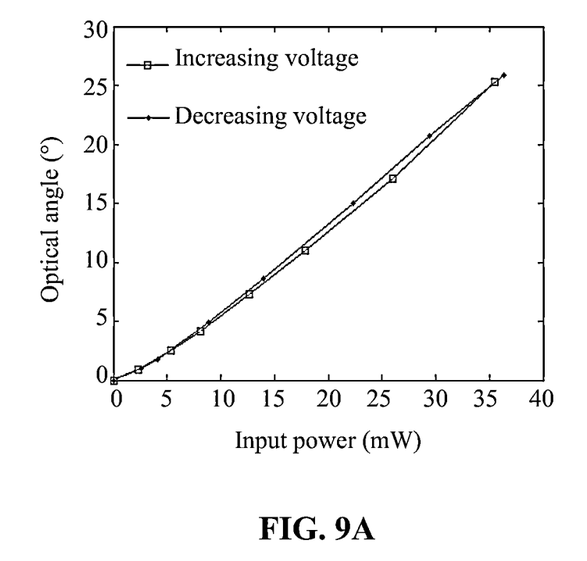
FIG. 9A represents a device fabricated with thermal isolation on both ends of actuators and FIG. 9B represents a device fabricated with thermal isolation between actuators and mirror plate.
Figure 9B:
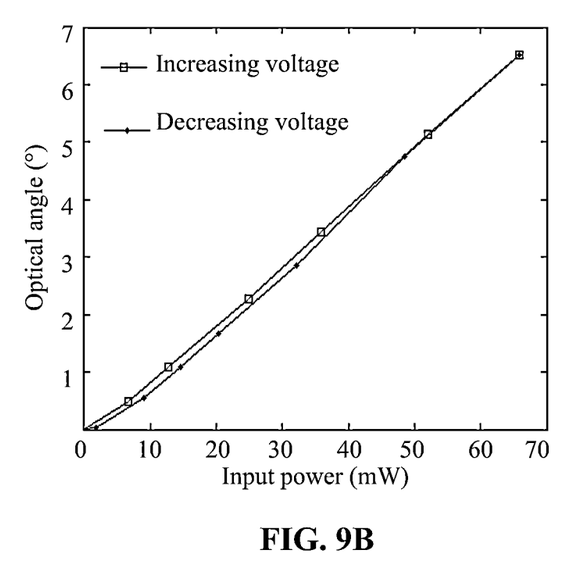

FIG. 9A shows a plot indicating power consumption for a device with the first type of thermal isolation (isolation on both ends of actuators) and FIG. 9B shows a plot indicating power consumption for a device with the second type of thermal isolation (isolation between the actuators and the mirror plate only). As can be seen by comparing the plots of FIG. 9A and FIG. 9B, a device with the first type of thermal isolation consumes less power than a device with the second type of thermal isolation for the same scan angle.

Figure 10A:
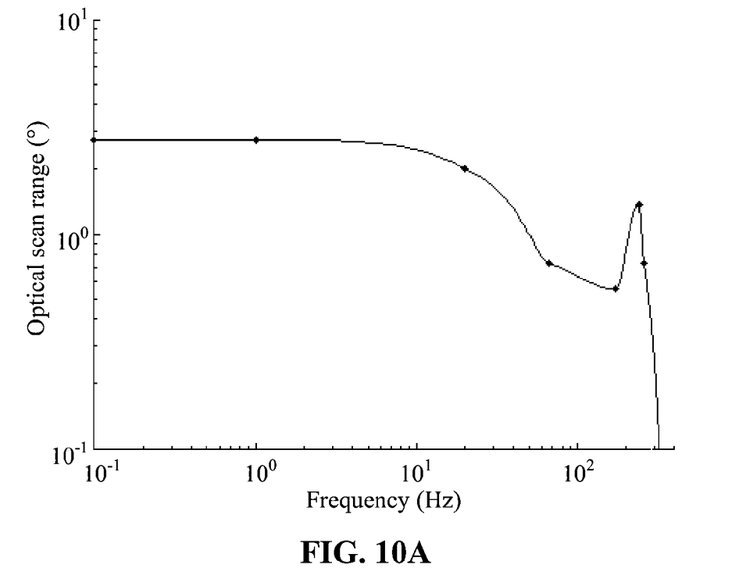
FIGS. 10A and 10B show plots of the frequency response for the device fabricated with thermal isolation on both ends of actuators (FIG. 10A) and the device fabricated with thermal isolation between actuators and mirror plate (FIG. 10B). For the plot of FIG. 10A, a sinusoidal voltage of 25 mV amplitude and dc bias of 870 mV was applied; and for the plot of FIG. 10B, a sinusoidal voltage of 46.5 mV amplitude and dc bias of 799.5 mV was applied.
Figure 10B:
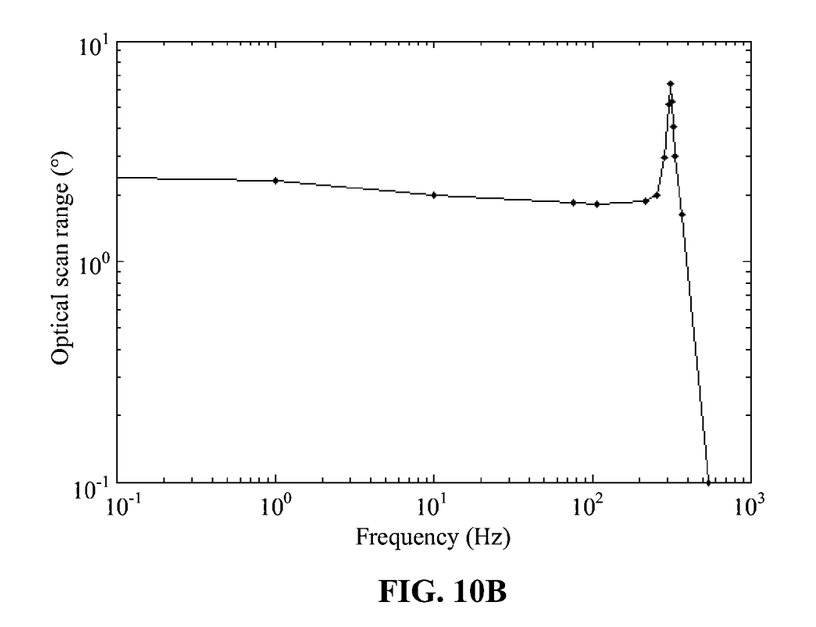

FIG. 10A shows a plot indicating frequency response for a device with the first type of thermal isolation (isolation on both ends of actuators) and FIG. 10B shows a plot indicating frequency response for a device with the second type of thermal isolation (isolation between the actuators and the mirror plate only). As can be seen by comparing the plots of FIG. 10A and FIG. 10B, the device having the second type of thermal isolation provides a faster response time than the device having the first type of thermal isolation (and also has a flatter frequency response).

Therefore, a design using isolation on both ends of the actuators trades off speed for reduced power consumption, and a design using isolation only between the actuators and the mirror plate achieves high speed at the expense of higher power consumption.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A method of fabricating an electrothermal micro-electrical-mechanical system (MEMS), the method comprising:
   providing a silicon-on-insulator (SOI) substrate having a silicon bulk layer, a buried oxide layer and a silicon device layer;
   forming a first insulating pattern on the SOI substrate including a contact pad region;
   depositing a first bimorph material layer of tungsten, 64FeNi, or diamond-like carbon (DLC) on the SOI substrate including the first insulating pattern;
   depositing a first oxide on the first bimorph material layer and etching the first oxide to form a first oxide pattern defining a bimorph beam and the contact pad region;
   etching the first bimorph material layer using the first oxide pattern as an etch mask;
   depositing a second bimorph material on the SOI substrate including the etched first bimorph material and patterning the deposited second bimorph material to form a platform on the SOI substrate and the bimorph beam comprising the first bimorph material layer, and the patterned second bimorph material layer;
   performing a first backside-etch of the silicon bulk layer to expose the buried oxide layer below the bimorph beam and the platform;
   performing a second backside-etch of the buried oxide layer to expose the silicon device layer below the bimorph beam and the platform; and
   performing a front-side etching of the silicon device layer to release the bimorph beam after the performing of the first backside-etch and the second backside-etch.

2. The method according to claim 1, wherein forming the first insulating pattern on the SOI substrate including the contact pad region comprises:
   depositing a first insulating layer on the SOI substrate and etching the first insulating layer to form the first insulating layer pattern on the contact pad region.

3. The method according to claim 1, wherein forming the first insulating pattern on the SOI substrate including the contact pad region comprises:
   forming a trench in the silicon device layer of the SOI substrate and filling the trench with a first insulating layer material.

4. The method according to claim 1, further comprising removing the first oxide from the contact pad region while remaining the first oxide pattern on the bimorph beam before depositing the second bimorph material on the SOI substrate,
   wherein the second bimorph material is deposited on the SOI substrate and the first oxide pattern remaining on the bimorph beam,
   wherein the bimorph beam comprises the first bimorph material layer, the first oxide pattern, and the patterned second bimorph material layer.

5. The method according to claim 1, further comprising forming a thermal isolation material pattern providing isolation at a side of the bimorph beam.

6. The method according to claim 5, wherein the thermal isolation material comprises polymer.

7. The method according to claim 5, wherein the thermal isolation material is polyimide.

8. The method according to claim 5, wherein the forming of the thermal isolation material pattern providing isolation at the side of the bimorph beam is performed, in part, before forming the first insulating pattern on the SOI substrate including the contact pad region.

9. The method according to claim 5, wherein the thermal isolation material pattern is formed at both ends of the bimorph beam.

10. The method according to claim 5, wherein forming the thermal isolation material pattern providing isolation at a side of the bimorph beam comprises:
    forming the thermal isolation material pattern on the second bimorph material, connecting the bimorph beam to the platform.

11. The method according to claim 10, wherein forming the thermal isolation material pattern on the second bimorph material, connecting the bimorph beam to the platform comprises:
    depositing the thermal isolation material on the SOI substrate including the patterned second bimorph material and etching the thermal isolation material such that the thermal isolation material contacts a portion of the second bimorph material pattern of the bimorph beam, a portion of the platform, and a portion of the silicon device layer between the bimorph beam and the platform.

12. The method according to claim 10, wherein forming the thermal isolation material pattern on the second bimorph material, connecting the bimorph beam to the platform comprises:
    performing an isotropic etch of the silicon device layer between the bimorph beam and the platform to form a trench in the silicon device layer;
    depositing the thermal isolation layer on the SOI substrate including the patterned second bimorph material;
    applying a vacuum pressure such that the deposited thermal isolation layer fills the trench; and
    etching the thermal isolation layer such that the thermal isolation layer contacts a portion of the second bimorph material pattern of the bimorph beam and a portion of the platform and remains in the trench.

13. The method according to claim 1, wherein the second bimorph material is aluminum.

14. The method according to claim 1, wherein the first bimorph material is 64FeNi or DLC and the second bimorph material is tungsten.

15. The method according to claim 1, wherein the first bimorph material is tungsten or DLC and the second bimorph material is 64FeNi or FeNi36.

16. The method according to claim 1, whereby the method fabricates a MEMS micromirror, the MEMS micromirror being provided in an optical display.

17. The method according to claim 1, whereby the method fabricates a MEMS micromirror, the MEMS micromirror being provided in a biomedical imaging device.

18. The method according to claim 1, whereby the method fabricates a MEMS micromirror, the MEMS micromirror being provided in a microscanner.

* * * * *